United States Patent
Wang et al.

(10) Patent No.: US 9,577,512 B2
(45) Date of Patent: Feb. 21, 2017

(54) CURRENT ZERO-CROSS DETECTION DEVICE, SIGNAL ACQUISITION CIRCUIT, AND CIRCUIT SYSTEM

(71) Applicant: ZTE CORPORATION, Shenzhen, Guangdong Province (CN)

(72) Inventors: Jing Wang, Shenzhen (CN); Junming Zhang, Shenzhen (CN); Jie Fan, Shenzhen (CN); Jianping Zhou, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days.

(21) Appl. No.: 14/896,668

(22) PCT Filed: Apr. 25, 2014

(86) PCT No.: PCT/CN2014/077218
§ 371 (c)(1),
(2) Date: Dec. 8, 2015

(87) PCT Pub. No.: WO2014/198172
PCT Pub. Date: Dec. 18, 2014

(65) Prior Publication Data
US 2016/0134185 A1    May 12, 2016

(30) Foreign Application Priority Data
Jun. 9, 2013  (CN) .......................... 2013 1 0231150

(51) Int. Cl.
*H02M 1/42* (2007.01)
*G01R 19/175* (2006.01)
(Continued)

(52) U.S. Cl.
CPC .............. *H02M 1/42* (2013.01); *G01R 19/175* (2013.01); *H02M 1/4233* (2013.01);
(Continued)

(58) Field of Classification Search
CPC ........................... H02M 1/4233; H02M 7/219
See application file for complete search history.

(56) References Cited

U.S. PATENT DOCUMENTS 7,630,221 B2 * 12/2009 Sui ............................ G05F 1/70
                                                                 323/207
8,717,791 B2 *  5/2014 Wildash .............. H02M 1/4208
                                                                 323/207
(Continued)

FOREIGN PATENT DOCUMENTS

CN           1855658 A        11/2006
CN         101707441 A         5/2010
(Continued)

*Primary Examiner* — Emily P Pham
(74) *Attorney, Agent, or Firm* — Ling Wu; Stephen Yang; Ling and Yang Intellectual Property (57) ABSTRACT

Disclosed are a current zero-cross detection device, zero-cross current signal acquisition circuit and totem pole bridgeless circuit system. The current zero-cross detection device includes a current transformer, first sampling switch, second sampling switch, sampling resister, comparator. The current transformer includes a primary winding and a secondary winding; the primary winding is connected to a circuit to be detected; two ends of the secondary winding are connected respectively to drain electrodes of the first and second sampling switches; source electrodes of first and second sampling switches are connected to ground; two ends of the sampling resistor are connected respectively to the drain electrode and source electrode of the second sampling switch; the negative input end of the comparator is connected to the drain electrode of the second sampling switch, its positive input end is connected to a reference voltage; the first and second sampling switches are in ON or OFF state.

11 Claims, 3 Drawing Sheets

(51) Int. Cl.
*H02M 7/219* (2006.01)
*H02M 1/00* (2006.01)

(52) U.S. Cl.
CPC .... *H02M 7/219* (2013.01); *H02M 2001/0009* (2013.01); *Y02B 70/126* (2013.01)

(56) References Cited

U.S. PATENT DOCUMENTS 9,036,376 B2 * 5/2015 Lawson .................... H02J 3/32
    363/21.12
2012/0293141 A1 * 11/2012 Zhang ................ H02M 1/4233
    323/207

FOREIGN PATENT DOCUMENTS

| CN | 101728964 A | 6/2010 |
|----|-------------|--------|
| CN | 102520232 A | 6/2012 |
| CN | 102545582 A | 7/2012 |
| CN | 102647099 A | 8/2012 |

* cited by examiner

CURRENT ZERO-CROSS DETECTION DEVICE, SIGNAL ACQUISITION CIRCUIT, AND CIRCUIT SYSTEM

TECHNICAL FIELD

The present document relates to the field of power supply, and more particularly, to a current zero-cross detection device, a zero-cross current signal acquisition circuit and a totem pole bridgeless circuit system.

BACKGROUND OF THE RELATED ART

Figure 1:
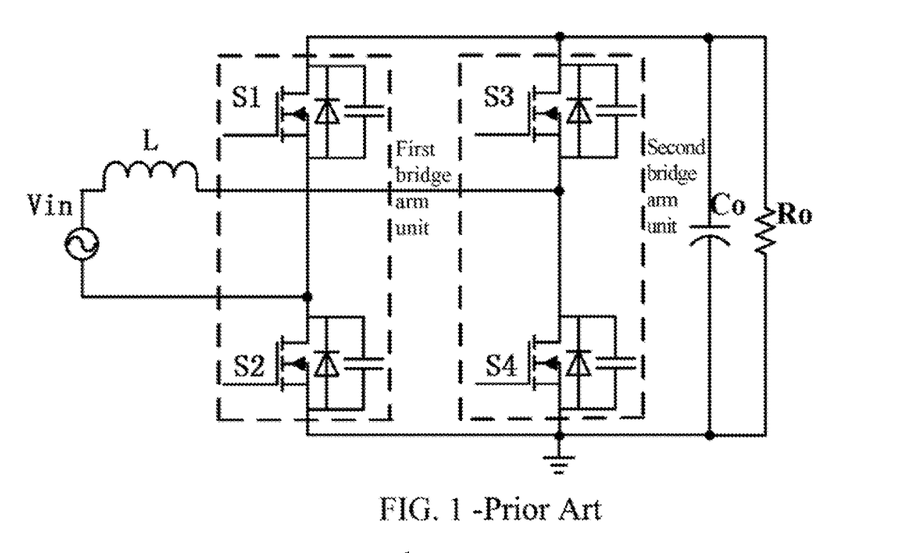
FIG. 1 is a schematic diagram of the structure of a totem pole bridgeless PFC system in the related art.

Research on single-phase Power Factor Correction (PFC) technology is towards the trend of high efficiency and high power density, and the totem pole bridgeless PFC topology is proposed in responsive to this trend, as shown in FIG. 1. In the totem pole bridgeless boost converter circuit system, a first bridge arm unit, a second bridge arm unit, and a capacitor Co are connected in parallel, with one connected end connected to the ground; the first bridge arm unit has two working frequency switches S1 and S2 connected in series in the same direction; a second bridge arm unit has two switches S3 and S4 connected in series in the same direction; an AC power supply Vin and an inductor L are connected between the connection point of two diodes and the connection point of two switches.

In the abovementioned totem pole bridgeless PFC circuit system, due to constraints of the topology itself, the totem pole PFC cannot use the fast recovery diode characteristics to improve EMI (Electro Magnetic Interference) as the two-way switch bridgeless PFC does, meanwhile the hard switching characteristics of the CCM (Continuous Conduction Mode) mode cannot meet the growing demand for high efficiency in the industry, therefore the totem pole bridgeless PFC control policy described in this application is based on the TCM (triangular current mode) mode, according to the simple topology of the totem pole, the high power density and high efficiency requirements can be met simultaneously if it is to control to achieve zero voltage switching (ZVS) or valley switching (VS) feature in full input voltage and full load range in the TCM mode.

However, during the process of practicing and studying the abovementioned control policy, the applicants of the present application found that: in the relevant totem pole conversion circuit system, based on the above control idea, it needs to timely and accurately detect the inductor current zero-cross signal of the PFC to achieve the timing control of working frequency switches S1 and S2 and high frequency switches S3 and S4, so as to achieve the ZVS or VS control in the full input voltage and full load range in the TCM mode.

SUMMARY

The present document provides a current zero-cross detection device, a zero-cross current signal acquisition circuit and a totem pole bridgeless circuit system to resolve the technical problem that it is difficult to control the timing of a totem pole bridgeless circuit system.

The present document provides a current zero-cross detection device which comprises a current transformer, a first sampling switch, a second sampling switch, a sampling resistor and a comparator, and the current transformer comprises a primary winding and a secondary winding; wherein:

the primary winding is connected with a circuit to be detected;

two ends of the secondary winding are connected respectively to drain electrodes of the first sampling switch and the second sampling switch;

a source electrode of the first sampling switch is connected to a source electrode of the second sampling switch, and the source electrodes are connected to ground;

two ends of the sampling resistor are respectively connected to the drain electrode and source electrode of the second sampling switch;

a negative input end of the comparator is connected to the drain electrode of the second sampling switch, and a positive input end of the comparator is connected to a reference voltage; and the first sampling switch and the second sampling switch are in an ON or OFF state.

Alternatively, the device further comprises a reset resistor, and two ends of the reset resistor are respectively connected to the two ends of the secondary winding.

Alternatively, the sampling switch is a metal-oxide-semiconductor field effect transistor (Mosfet), an insulated gate bipolar transistor (IGBT), or a bipolar transistor (BJT).

The present document further provides a current zero-cross signal acquisition circuit, wherein, the circuit comprises:

a first current zero-cross detection unit, located in a first circuit branch, and configured to collect a current flowing through the first circuit branch when an alternate current (AC) input voltage is in a positive half cycle, to acquire a current zero-cross signal of the first circuit branch;

a second current zero-cross detection unit, located in a second circuit branch and configured to collect a current flowing through the second circuit branch when the AC input voltage is in a negative half cycle to acquire a current zero-cross signal of the second circuit branch; and a signal processing circuit, configured to select the current zero-cross signal collected by the first current zero-cross detection unit when the AC input voltage is in the positive half cycle; and select the current zero-cross signal collected by the second current zero-cross detection unit when the AC input voltage is in the negative half cycle.

Alternatively, the first current zero-cross detection unit and the second current zero-cross detection unit have an identical structure, comprising a current transformer, a first sampling switch, a second sampling switch, a sampling resistor and a comparator, and the current transformer comprises a primary winding and a secondary winding; wherein:

the primary winding is connected with a circuit to be detected;

two ends of the secondary winding are respectively connected to drain electrodes of the first sampling switch and the second sampling switch;

a source electrode of the first sampling switch is connected to a source electrode of the second sampling switch, and the source electrodes are connected to ground;

two ends of the sampling resistor are respectively connected to the drain electrode and the source electrode of the second sampling switch; and a negative input end of the comparator is connected to the drain electrode of the second sampling switch, and a positive input end of the comparator is connected to a reference voltage.

Alternatively, the signal processing circuit comprises: a first AND gate, a second AND gate and an OR gate, an input end of the first AND gate is connected to an output end of the first current zero-cross detection unit and a first working frequency signal representing polarity of the AC input voltage; an input end of the second AND gate is connected to an output end of the second current zero-cross detection unit and a second working frequency signal representing polarity of the AC input voltage; an input end of the OR gate is connected to output ends of the first AND gate and the second AND gate.

Alternatively, the first current zero-cross detection unit and the second current zero-cross detection unit further comprise reset resistors, and two ends of the reset resistor are respectively connected to the two ends of the secondary winding.

The present document further provides a totem pole bridgeless circuit system, wherein the system comprises: a first bridge arm unit and a second bridge arm unit, wherein the first bridge arm unit and the second bridge arm unit are connected in parallel between a first parallel connection point and a second parallel connection point, the first bridge arm unit comprises a first switch and a second switch connected in series in the same direction; the second bridge arm unit comprises a third switch and a fourth switch connected in series in the same direction; a power supply and an inductor are connected between a first connection point between the first switch and the second switch and a second connection point between the third switch and the fourth switch, and the second bridge arm unit further comprises:

a first current zero-cross detection unit, a second current zero-cross detection unit and a signal processing circuit, wherein the first current zero-cross detection unit and the third switch are connected in series between the first parallel connection point and the second connection point; the second current zero-cross detection unit and the fourth switch are connected in series between the second parallel connection point and the second connection point; the signal processing circuit is connected to the first current zero-cross detection unit and the second current zero-cross detection unit;

the first current zero-cross detection unit is configured to, when an AC input voltage is in a positive half cycle and a body diode of the third switch is conducted, collect a current flowing through the third switch, and obtain a current zero-cross signal of the current flowing through the third switch;

the second current zero-cross detection unit is configured to, when the AC input voltage is in a negative half cycle and a body diode of the fourth switch is conducted, collect a current flowing through the fourth switch and obtain a current zero-cross signal of the current flowing through the fourth switch;

the signal processing circuit is configured to select the current zero-cross signal collected by the first current zero-cross detection unit when the AC input voltage is in the positive half axle; select the current zero-cross signal collected by the second current zero-cross detection unit when the AC input voltage is in the negative half cycle; and a switching control unit, connected to the signal processing circuit as well as the third switch and the fourth switch, and is configured to control ON or OFF of the third switch and the fourth switch according to a signal output by the signal processing circuit.

Alternatively, structures of the first current zero-cross detection unit and the second current zero-cross detection unit respectively comprise a current transformer, a first sampling switch, a second sampling switch, a sampling resistor and a comparator, and the current transformer comprises a primary winding and a secondary winding; wherein:

the primary winding is connected with a circuit to be detected;

two ends of the secondary winding are respectively connected to drain electrodes of the first sampling switch and the second sampling switch;

a source electrode of the first sampling switch is connected to a source electrode of the second sampling switch, and the source electrodes are connected to ground;

two ends of the sampling resistor are respectively connected to the drain electrode and the source electrode of the second sampling switch; and a negative input end of the comparator is connected to the drain electrode of the second sampling switch, and a positive input end thereof is connected to a reference voltage.

Alternatively, the signal processing circuit comprises: a first AND gate, a second AND gate and an OR gate, an input end of the first AND gate is connected to an output end of the first current zero-cross detection unit and a first working frequency signal representing polarity of the AC input voltage and output by the switching control unit; an input end of the second AND gate is connected to an output end of the second current zero-cross detection unit and a second working frequency signal representing polarity of the AC input voltage and output by the switching control unit; an input end of the OR gate is connected to output ends of the first AND gate and the second AND gate.

Alternatively, the first current zero-cross detection unit and the second current zero-cross detection unit further comprise reset resistors, and two ends of the reset resistor are respectively connected to the two ends of the secondary winding.

The current zero-cross detection device, current zero-cross signal acquisition circuit and totem pole bridgeless circuit system in accordance with the embodiment of the present document control the ON and OFF state of a switch by collecting the current zero-cross signal to achieve the ZVS or VS control in the full input voltage and full load range under the TCM mode, and to improve the efficiency of the totem pole bridgeless PFC system.

PREFERRED EMBODIMENTS OF THE INVENTION

Hereinafter in conjunction with the accompanying drawings in the embodiments of the present document, the technical scheme in the embodiments of the present document will be described clearly and completely. Based on the embodiments of the present document, all other embodiments obtained by those with ordinary skill in the art without creative efforts should be within the protection scope of the present document. It should be noted that, in the case of no conflict, embodiments and features in the embodiments in the present application may be arbitrarily combined with each other.

Figure 2:
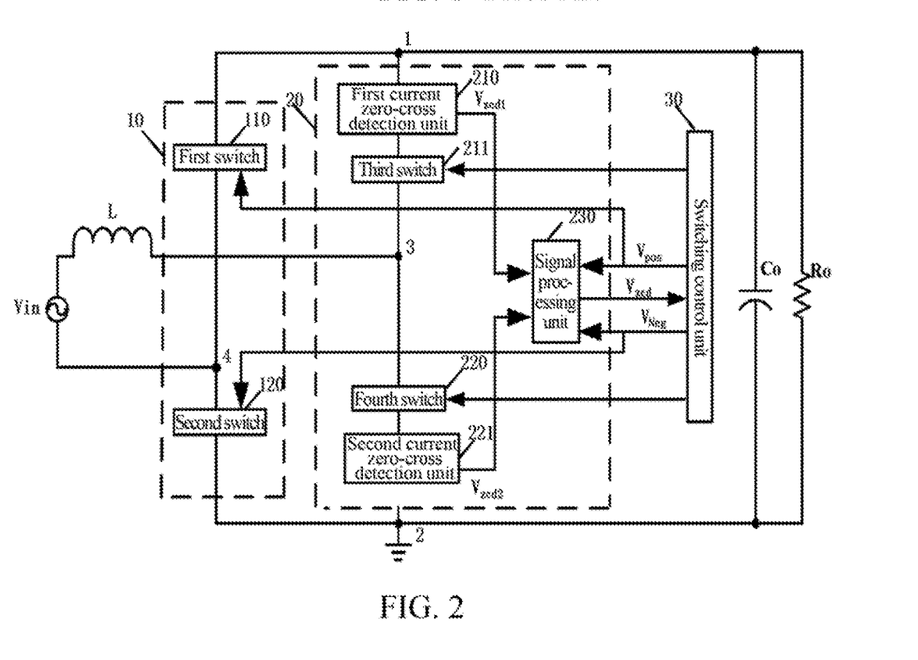
FIG. 2 is a schematic diagram of the structure of a totem pole bridgeless PFC system provided in an embodiment of the present document.

The schematic diagram of the structure of the totem Pole bridgeless PFC circuit system according to the embodiment of the present document is shown in FIG. 2, comprising:

the first bridge arm unit 10 and the second bridge arm unit 20 connected in parallel between the first parallel connection point 1 and the second parallel connection point 2, wherein the first bridge arm unit 10 comprises the first switch 110 and the second switch 120 connected in series in the same direction; the second bridge arm unit 20 comprises the third switch 211 and the fourth switch 220 connected in series in the same direction; the power supply Vin and the inductor L are connected between the first connection point 4 between the first switch 110 and the second switch 120 and the second connection point 3 between the third switch 211 and the fourth switch 220, and the second bridge arm unit 20 further comprises:

the first and second current zero cross detection units 210 and 221 and the signal processing circuit 230, wherein the first current zero-cross detection unit 210 and the third switch 211 in the two switches are connected in series between the first parallel connection point 1 and the second connection point 3; the second current zero-cross detection unit 221 and the fourth switch 220 in the two switches are connected in series between the second parallel connection point 2 and the second connection point 3; the signal processing circuit 230 is connected to the first current zero-cross detection unit 210 and the second current zero-cross detection unit 221;

the first current zero-cross detection unit 210 is configured to collect the current flowing through the body diode of the third switch 211 and obtain its current zero cross signal when the AC input voltage is in the positive half cycle and the body diode of the third switch 211 is conducted, and release the energy collected by the first current zero-cross detection unit 210 when the body diode of the third switch 211 is cut off;

the second current zero-cross detection unit is configured to collect the current flowing through the body diode of the fourth switch 220 and obtain its current zero-cross signal when the AC input voltage is in the negative half cycle and the body diode of the fourth switch 220 is conducted; release the energy collected by the second current zero-cross detection unit 221 when the fourth switch 220 is switched off;

the signal processing circuit 230 is configured to select the current zero-cross signal collected by the first current zero-cross detection unit 210 when the AC input voltage is in the positive half axis; select the current zero-cross signal collected by the second current zero-cross detection unit 220 when the AC input voltage is in the negative half cycle; and a switching control unit 30, connected to the first switch 120 and the second switch 110, and is configured to provide two working frequency signals which represent the AC input voltage polarities and are complementary, to control the ON or OFF of the first switch 110 and the second switch 120; it is connected to the signal processing circuit 230, the third switch 211 and the fourth switch 220, and controls the ON and OFF of the third switch 211 or the fourth switch 221 according to the signal output by the signal processing circuit 230.

Accordingly, the current signal output ends of the first current zero-cross detection unit 210 and the second current zero-cross detection unit 221 are connected to the input end of the signal processing circuit 230; and two control output ends of the switching control unit 30 provides the signal processing circuit 230 with two working frequency signals representing the AC input voltage polarities, these two control output ends are also directly connected with the first switch 110 and the second switch 220, the other two control outputs are connected with the third switch 211 and the fourth switch 221, so that when the AC input voltage is in the positive half cycle, the second switch 120 is always conducted, and when the body diode of the third switch 211 is conducted or cut off, the first current zero-cross detection unit 210 correspondingly collects current or releases energy, meanwhile, when in the negative half cycle, the first switch 110 is always conducted, while when the body diode of the fourth switch 220 is conducted or cut off, the second current zero-cross detection unit 221 correspondingly collects current or releases energy.

Thus, after the current zero-cross signals of the first current zero-cross detection unit 210 and the second current zero-cross detection unit 221 are signal-selected by the signal processing circuit 230 in different polarities of the AC input voltage, the signals are sent to the control input end of the switching control unit 30, the switching control unit 30 controls the ON and OFF of the switch, if the AC input voltage works in the positive half cycle, the switching control unit 30 controls the second switch 120 to be conducted, and meanwhile obtains the current zero-cross signal of the first current zero-cross detection unit 210 according to the selection of the signal processing circuit 230, then adds a preset delay to control the on of the fourth switch 220 on the basis of the signal.

Accordingly, the preset delay is set according to the reverse recovery time and resonance time of the selected MOS transistor.

The first current zero-cross detection unit 210 and the second current zero-cross detection unit 221 may be implemented with the same method, such as implemented with components such as the current transformer. Therefore, when the AC input power suppler is in the positive half cycle, the second switch 120 and the fourth switch 220 are switched on, and the third switch 211 is switched off, then the inductor L, the fourth switch 220, the second switch 120 and the second current zero-cross detection unit 221 form a energy storage circuit, while the second current zero-cross detection unit 221 does not collect the current zero-cross signal of the fourth switch 220, the secondary winding of the current transformer is directly short by the sampling switch; when the energy storage of the inductor L completes, the second switch 120 and the third switch 211 are switched on, while the fourth switch 220 is switched off, then the inductor L, the third switch 211, the second switch 120 and the first current zero-cross detection unit 210 form a continuing current circuit and release the energy in the inductor L, at this time, the first current zero-cross detection unit 210 will collect the forward current zero-cross signal of the third switch 211, and the secondary winding of the current transformer in the second current zero-cross detection unit 221 is still in the short-circuit state.

When the AC input power supply is in the negative half cycle, the first switch 110 and the third switch 211 are switched on, and the fourth switch 220 is switched off, at this time, the third switch 211, the first switch 110, the inductor L and the first current zero-cross detection unit 210 form a energy storage circuit, and at this time, the first current zero-cross detection unit 210 does not collect the current zero-cross signal of the third switch 211, the secondary winding of its current transformer is directly short by the sampling switch; When the energy storage of the inductor L completes, the first switch 110 and the fourth switch 220 are switched on, and the third switch 211 is switched off, at this time, the fourth switch 220, the first switch 110, the inductor L and the second current zero-cross detection unit 221 form a continuing current circuit and release the energy in the inductor L, now the second current zero-cross detection unit 221 collects the forward current zero-cross signal of the fourth switch 220, and the secondary winding of the current transformer in the first current zero-cross detection unit 210 is still in the short-circuit state.

Thus, in the entire working frequency cycle, it only needs to sample the forward current zero-cross signal flowing through the switch or switch body diode in the continuing current circuit. That is, when the AC input power supply is in the positive half cycle, it only needs the first current zero-cross detection unit 210 to collect the forward current zero-cross signal of the third switch 211; when the AC input power supply is in the negative half cycle, it only needs the second current zero-cross detection unit 221 to collect the forward current zero-cross signal of the fourth switch 220.

As can be seen from the control principle of the abovementioned circuit system, when the AC input power supply is in the positive half cycle, it needs to control the first current zero-cross detection unit 210 to sample to obtain the forward current zero-cross signal of the third switch 211, while the second current zero cross detection unit 221 does not sample the zero current signal; similarly, in the negative half cycle, the second current zero-cross detection unit 221 samples to obtain the forward current zero-cross signal of the fourth switch 220, while the first current zero-cross detection unit 210 does not sample the zero current signal.

Figure 3:
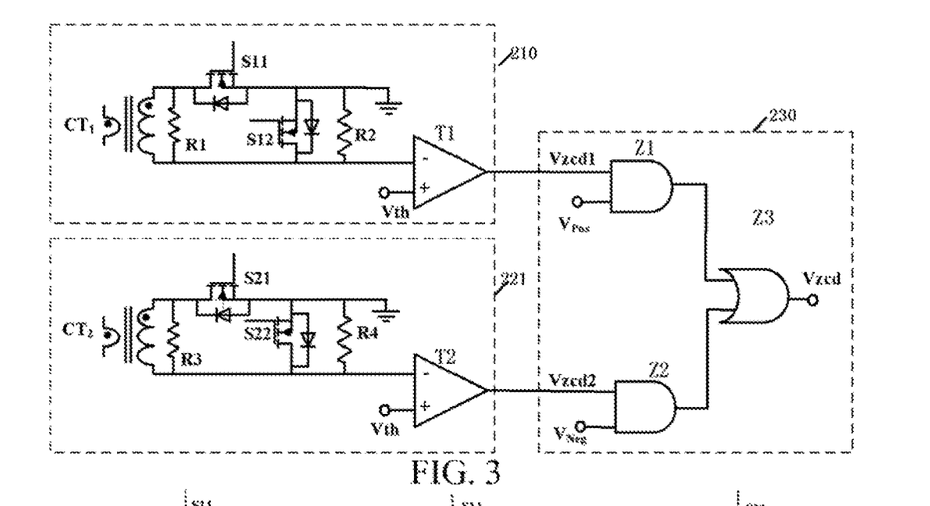
FIG. 3 is a circuit diagram of a current zero-cross detection system of the totem pole bridgeless PFC system provided in an embodiment of the present document.
Figure 4:
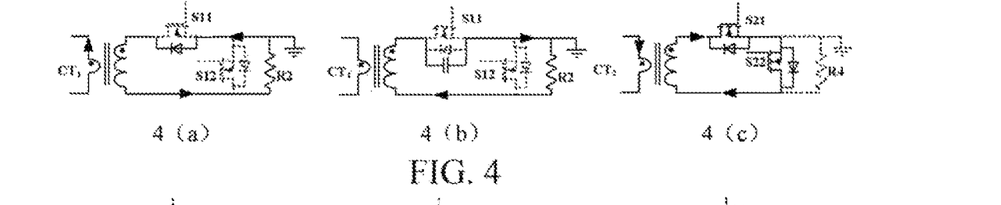
FIG. 4 is a circuit diagram of a current zero-cross detection unit in the totem pole bridgeless PFC system working in an AC positive half cycle provided in an embodiment of the present document.
Figure 5:
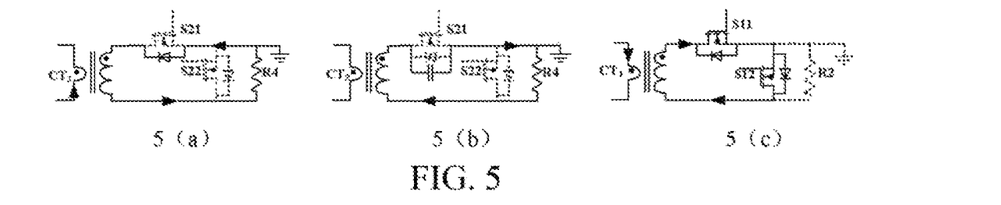
FIG. 5 is a circuit diagram of the current zero-cross detection unit in the totem pole bridgeless PFC system provided working in the AC negative half axle in the embodiment of the present document.

With reference to FIG. 3, FIG. 4 and FIG. 5, in one specific embodiment, the first current zero-cross detection unit 210 and the second current zero-cross detection unit 221 are implemented in the same manner.

Wherein the first current zero-cross detection unit 210 comprises:

A current transformer CT1, two sampling switches S11 and S12, a sampling resistor R2 and a comparator T1, wherein the current transformer CT1 comprises a primary winding and a secondary winding; an optional reset resistor R1 is connected in parallel to the two ends of the secondary winding of the current transformer CT1, but it should be noted that, the R1 may not be included.

The two sampling switches S11 and S12 are connected in series and then connected in parallel with the secondary winding of the current transformer; wherein the drain electrode of the first sampling switch S11 is connected to one end of the secondary winding, the source electrode of the first sampling switch S11 is connected to the drain electrode of the second sampling switch S12, the source electrode of the second sampling switch S12 is connected to the other end of the secondary winding; the sampling resistor R2 is connected in parallel with the source electrode and the drain electrode of the second sampling switch S12.

The second current zero-cross detection unit 221 comprises:

A current transformer CT2, two sampling switches S21 and S22, a sampling resistor R4, and a comparator T2, the current transformer CT2 comprises a primary winding and a secondary winding; an optional reset impedance R3, which is connected in parallel with both ends of the secondary winding of the current transformer CT1, it should be noted that, the R3 may not be included.

The two sampling switches S21 and S22 are connected in series and then connected in parallel with the secondary winding of the current transformer; wherein the drain electrode of the first sampling switch S21 is connected to one end of the secondary winding, the source electrode of the first sampling switch S21 is connected to the drain electrode of the second sampling switch S22, the source electrode of the second sampling switch S22 is connected to the other end of the secondary winding; the sampling resistor R4 is connected in parallel with the source electrode and the drain electrode of the second sampling switch S22.

The abovementioned comparators T1 and T2 are connected to the signal processing circuit 230, when the AC input power is in the positive half cycle, the output end of the comparator T1 is the forward current zero-cross signal sampled by the first current zero-cross detection unit 210; when the AC input power supply is in the negative half cycle, the output end of the comparator T2 is the forward current zero-cross signal sampled by the second current zero-cross detection unit 221.

In general, the sampling switch comprises a body diode and a parasitic capacitor, wherein the parasitic capacitor is used to reset to achieve the volt-second balance.

The signal processing circuit 230 comprises the first and second AND gates Z1 and Z2, and an OR gate Z3. The input end of the first AND gate Z1 is connected to the output end of the first current zero-cross detection unit 210 as well as the first working frequency signal representing the AC input voltage polarity and output by the switching control unit 30; the output end of the second AND gate Z2 is connected to the output end of the second current zero-cross detection unit 221 as well as the second working frequency signal representing the AC input voltage polarity and output by the switching control unit 30; the input end of the OR gate Z3 is connected to the output ends of the first AND gate Z1 and the second AND gate Z2.

Accordingly, when the AC input voltage is respectively in the positive and negative half cycles, the switching control unit provides two working frequency signals representing the AC input voltage polarities, the two working frequency signals are respectively AND with the zero-cross signal obtained by the corresponding current zero-cross detection unit to obtain effective current zero-cross signals in the positive and negative half cycles, and then they are superimposed through the OR gate to obtain the current zero-cross detection signal over the full input voltage range.

When the current zero-cross detection unit in the present embodiment works in the positive half cycle of the AC input voltage, it is shown as FIGS. 4($a$), 4($b$) and 4($c$).

The working principle of the current zero-cross detection unit in the third switch is as follows: in the positive half cycle of the entire AC input voltage, it is to control to switch off the sampling switches S11 and S12 corresponding to the third switch, and conduct the sampling switches S21 and S22 corresponding to the fourth switch. At this time, when the body diode of the third switch is conducted, that is, when the current shown in FIG. 4 ($a$) flows through the primary winding of the current transformer CT1, the secondary winding of current transformer CT1 induces the current shown in FIG. 4($a$), the secondary winding of the current transformer CT1, the sampling resistor R2 and the body diode of the sampling switch S11 form a sampling circuit, i.e., the solid circuit in FIG. 4($a$), and collect the current flowing through the connected third switch in the arrow direction shown in FIG. 4(a); in the period when the third switch is switched off, energy stored in the magnetizing inductor of the current transformer CT1 is reset via the parasitic capacitor of the sampling switch S11, as shown in FIG. 4(b). When the secondary winding of the CT1 is connected in parallel with the optional reset resistor R1 shown in FIG. 3, the energy stored in the magnetizing inductor can also be reset via the R1, which will not be described in detail herein.

In the positive half cycle, the current transformer CT2 does not need to collect the current, the secondary winding of the current transformer CT2 is directly short by the sampling switches S21 and S22, and its working state is as shown in FIG. 4(c).

When the current zero-cross detection unit works in the negative half cycle of the AC input voltage in the present embodiment, it is as shown in FIGS. 5 (a), 5 (b) and 5 (c).

The working principle of the current zero-cross detection unit in the fourth switch is as follows: in the negative half cycle of the entire AC input voltage, it is to control to switch off the sampling switches S21 and S22 corresponding to the fourth switch, and conduct the sampling switches S11 and S12 corresponding to the third switch. At this time, the body diode of the fourth switch is conducted, that is, when the current shown in FIG. 5(a) flows through the primary winding of the current transformer CT2, the secondary winding of current transformer CT2 induces the current shown in the FIG. 5(a), the secondary winding of the current transformer CT2, the sampling resistor R4 and the body diode of the sampling switch S21 form a sampling circuit, i.e., the solid circuit in FIG. 5(a), and collect the current flowing through the connected fourth switch in the arrow direction shown in FIG. 5(a); in the period when the fourth switch is switched off, energy stored in the magnetizing inductor of the current transformers CT2 is reset via the parasitic capacitor of the switch S21, as shown in FIG. 5(b). When the secondary winding of the CT2 is connected in parallel with the optional reset resistor R3 shown in FIG. 3, the energy stored in the magnetizing inductor can also be reset via the R3, which will not be described in detail herein.

In the negative half cycle, the current transformer CT2 does not need to collect the current, the secondary winding of the current transformer CT2 is directly short by the sampling switches S11 and S12, and its working state is as shown in FIG. 5(c).

Figure 6:
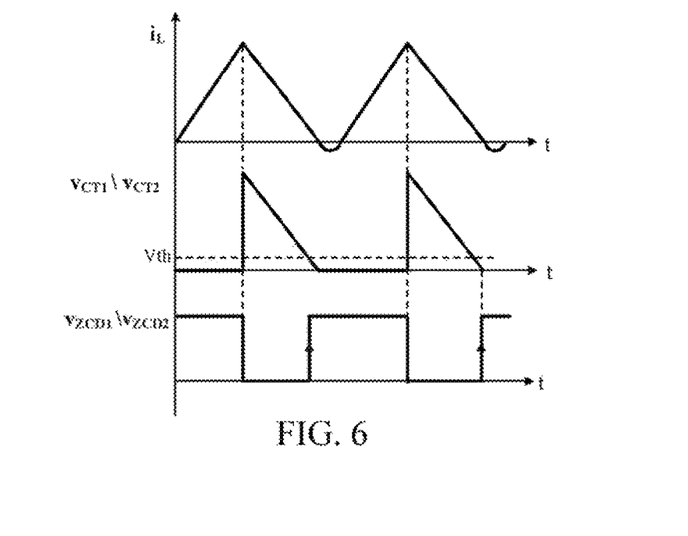
FIG. 6 is a working waveform diagram of the current zero-cross detection unit in the totem pole bridgeless PFC system provided in an embodiment of the present document.

According to the above analysis, it can be seen that, when the totem pole bridgeless PFC works in the TCM working mode, the current transformer only samples the current flowing through the switch in its continuing current circuit, that is, it only samples the current in the segment where the inductor current falls, and hereby obtains the current zero-cross signal, its working waveform is shown in FIG. 6. $V_{CT1}$ is the voltage of the sampling resistor R2 in the working frequency positive half cycle, and $V_{CT2}$ is the voltage of the sampling resistor R4 in the working frequency negative half cycle. Comparing the voltage signal with the reference voltage Vth of the comparator, and when the sampled voltage is less than Vth, the comparator inverts and outputs a high level, thus receiving the zero-cross detection signal in the segment where the inductor current falls, and the signal can be used to switch off the corresponding continuing current switch, as well as to add a certain delay on the basis of the signal to switch on the primary switch.

Wherein, the third switch is a continuing current tube and the fourth switch is the primary switch in the working frequency positive half cycle, and on the contrary, the fourth switch is a continuing current tube and the third switch is the primary switch in the working frequency negative half-cycle.

Figure 7:
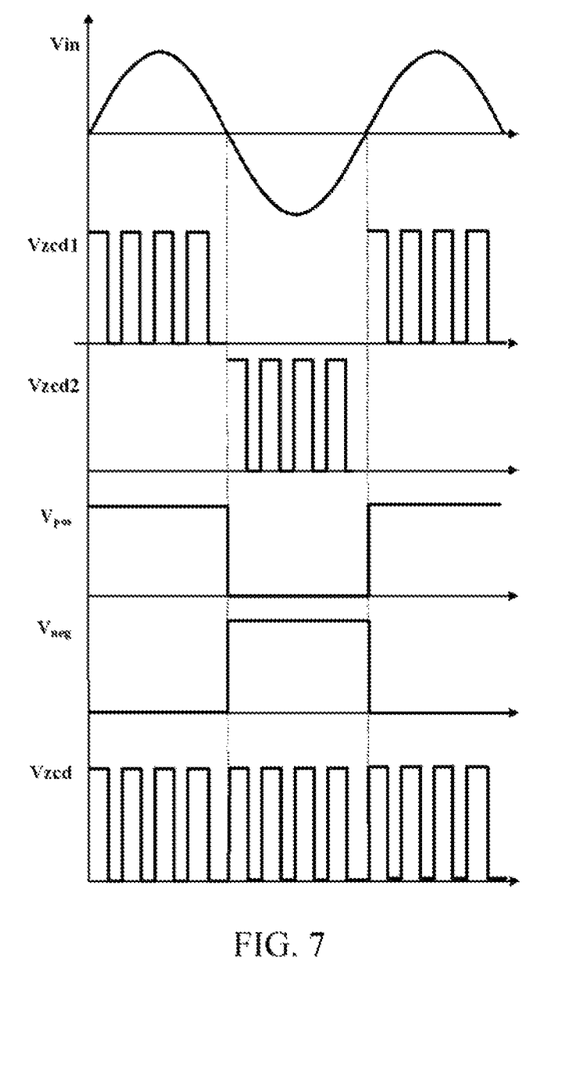
FIG. 7 is a working waveform diagram of a signal processing circuit in the totem pole bridgeless PFC system provided in an embodiment of the present document.

The working waveform of the signal processing circuit is shown in FIG. 7: when the AC input voltage Vin is in the positive half cycle, the obtained effective zero current detection signals Vzcd1 and Vzcd2 are invalid signals, on the contrary, when the AC input voltage Vin is in the negative half-cycle, the effective zero current detection signal Vzcd2 is obtained, while the Vzcd1 is an invalid signal. Thus, a switching control unit is used to provide working frequency signals VPos and VNeg representing the positive half cycle and the negative half cycle, that is, these two signals are used to control the ON or OFF of the first switch and the second switch in the first bridge arm, and also used to obtain the effective zero current detection signal Vzcd in both positive and negative half cycles after respectively shielding the unwanted signals in the positive and negative half cycles.

In summary, the totem pole bridgeless PFC circuit in the embodiment of the present document comprises a signal processing circuit and a switching control unit, two current zero-cross detection units are added in the second bridge arm unit, the forward current zero-cross signals collected by the switching control unit via the first current zero-cross detection unit and the second current zero-cross detection unit are signal-processed by the signal processing circuit to obtain the current zero-cross signals which are respectively used for controlling the ON or OFF of the third switch and the fourth switch in the second bridge arm unit. Compared to the totem pole bridgeless PFC circuit system in the related art, the system in accordance with the embodiment of the present document controls the ON and OFF of the switch by sampling the current zero signal of the inductor, to achieve the ZVS or VS control within the full input voltage and full load range under the TCM mode, so as to effectively realize the timing control of the totem pole bridgeless circuit system and improve the efficiency of the totem pole bridgeless PFC system.

The embodiment of the present document further provides a current zero-cross detection device, as shown in FIG. 3, the device comprises a current transformer, a first sampling switch, a second sampling switch, a sampling resistor and a comparator, wherein the current transformer comprises a primary winding and a secondary winding; wherein:

the primary winding is connected with a circuit to be detected;

two ends of the secondary winding are respectively connected to the drain electrodes of the first sampling switch and the second sampling switch;

the source electrode of the first sampling switch is connected to the source electrode of the second sampling switch, and the source electrodes are connected to ground;

two ends of the sampling resistor are respectively connected to the drain electrode and the source electrode of the second sampling switch;

the negative input end of the comparator is connected to the drain electrode of the second sampling switch, and the positive input end of the comparator is connected to a reference voltage;

the first and second sampling switches are in an ON or OFF state.

Alternatively, the device further comprises a reset resistor, and two ends of the reset resistor are respectively connected to two ends of the secondary winding.

The sampling switch is a metal-oxide-semiconductor field effect transistor (Mosfet), an insulated gate bipolar transistor (IGBT), or a bipolar transistor (BJT).

Furthermore, the present document further provides a current zero-cross signal acquisition circuit, wherein, the circuit comprises:

a first current zero-cross detection unit, located in a first circuit branch, and configured to collect a current flowing through the first circuit branch when an alternate current (AC) input voltage is in a positive half cycle, to acquire a current zero-cross signal of the first circuit branch;

a second current zero-cross detection unit, located in a second circuit branch and configured to collect a current flowing through the second circuit branch when the AC input voltage is in a negative half cycle, to acquire a current zero-cross signal of the second circuit branch; and a signal processing circuit, configured to select the current zero-cross signal collected by the first current zero-cross detection unit when the AC input voltage is in the positive half cycle; and select the current zero-cross signal collected by the second current zero-cross detection unit when the AC input voltage is in the negative half cycle.

The first and second current zero-cross detection units have an identical structure, comprising a current transformer, a first sampling switch, a second sampling switch, a sampling resistor and a comparator, wherein the current transformer comprises a primary winding and a secondary winding; wherein:

the primary winding is connected with a circuit to be detected;

two ends of the secondary winding are respectively connected to drain electrodes of the first sampling switch and the second sampling switch;

a source electrode of the first sampling switch is connected to a source electrode of the second sampling switch, and the source electrodes are connected to ground;

two ends of the sampling resistor are respectively connected to the drain electrode and the source electrode of the second sampling switch;

the negative input end of the comparator is connected to the drain electrode of the second sampling switch, and the positive input end of the comparator is connected to a reference voltage;

alternatively, the signal processing circuit comprises: a first AND gate, a second AND gate and an OR gate, the input end of the first AND gate is connected to the output end of the first current zero-cross detection unit and a first working frequency signal representing the AC input voltage polarity; the input end of the second AND gate is connected to the output end of the second current zero-cross detection unit and a second working frequency signal representing the AC input voltage polarity; the input end of the OR gate is connected to the output ends of the first AND gate and the second AND gate.

The first and second current zero-cross detection units further comprise reset resistors, and two ends of the reset resistor are respectively connected to two ends of the secondary winding.

The current zero-cross detection unit in accordance with the embodiment of the present document can collect the AC current zero-cross signal, i.e., collecting the current zero-cross signal via a energy storage circuit consisting of the secondary winding of the current transformer, two sampling switches, one sampling resistor and one comparator.

The above description is only a detailed description of the present document in conjunction with preferred specific embodiments, and it cannot be considered that the specific implementation of the present document is only limited to these embodiments. For professional and technical staff skilled in the field of the present document, any simple deductions or replacements made on the above embodiments according to the technical nature of the present document without departing from the inventive concept of the present document still belong to the protection scope of the present document.

INDUSTRIAL APPLICABILITY

The current zero-cross detection device, current zero-cross signal acquisition circuit and totem pole bridgeless circuit system in accordance with the embodiment of the present document control the ON and OFF state of a switch by collecting the current zero-cross signal to achieve the ZVS or VS control in the full input voltage and full load range under the TCM mode, and to improve the efficiency of the totem pole bridgeless PFC system.

What is claimed is:

1. A current zero-cross detection device, comprising a current transformer, a first sampling switch, a second sampling switch, a sampling resistor and a comparator, wherein the current transformer comprises a primary winding and a secondary winding; wherein:

the primary winding is connected with a circuit to be detected;

two ends of the secondary winding are connected respectively to drain electrodes of the first sampling switch and the second sampling switch;

a source electrode of the first sampling switch is connected to a source electrode of the second sampling switch, and the source electrodes are connected to ground;

two ends of the sampling resistor are respectively connected to the drain electrode and source electrode of the second sampling switch;

a negative input end of the comparator is connected to the drain electrode of the second sampling switch, and a positive input end of the comparator is connected to a reference voltage; and the first sampling switch and the second sampling switch are in an ON or OFF state.

2. The device of claim 1, wherein, the device further comprises a reset resistor, and two ends of the reset resistor are respectively connected to the two ends of the secondary winding.

3. The device of claim 1, wherein, the sampling switch is a metal-oxide-semiconductor field effect transistor (Mosfet), an insulated gate bipolar transistor (IGBT), or a bipolar transistor (BJT).

4. A current zero-cross signal acquisition circuit, comprising:

a first current zero-cross detection unit, located in a first circuit branch, and configured to collect a current flowing through the first circuit branch when an alternate current (AC) input voltage is in a positive half cycle, to acquire a current zero-cross signal of the first circuit branch;

a second current zero-cross detection unit, located in a second circuit branch and configured to collect a current flowing through the second circuit branch when the AC input voltage is in a negative half cycle, to acquire a current zero-cross signal of the second circuit branch; and a signal processing circuit, configured to select the current zero-cross signal collected by the first current zero-cross detection unit when the AC input voltage is in the positive half cycle; and select the current zero-cross signal collected by the second current zero-cross detection unit when the AC input voltage is in the negative half cycle.

5. The circuit of claim 4, wherein, the first current zero-cross detection unit and the second current zero-cross detection unit have an identical structure, comprising a current transformer, a first sampling switch, a second sampling switch, a sampling resistor and a comparator, and the current transformer comprises a primary winding and a secondary winding; wherein:
the primary winding is connected with a circuit to be detected;
two ends of the secondary winding are respectively connected to drain electrodes of the first sampling switch and the second sampling switch;
a source electrode of the first sampling switch is connected to a source electrode of the second sampling switch, and the source electrodes are connected to ground;
two ends of the sampling resistor are respectively connected to the drain electrode and the source electrode of the second sampling switch; and
a negative input end of the comparator is connected to the drain electrode of the second sampling switch, and a positive input end of the comparator is connected to a reference voltage.

6. The circuit of claim 4, wherein, the signal processing circuit comprises: a first AND gate, a second AND gate and an OR gate, an input end of the first AND gate is connected to an output end of the first current zero-cross detection unit and a first working frequency signal representing polarity of the AC input voltage; an input end of the second AND gate is connected to an output end of the second current zero-cross detection unit and a second working frequency signal representing polarity of the AC input voltage; an input end of the OR gate is connected to output ends of the first AND gate and the second AND gate.

7. The circuit of claim 4, wherein, the first current zero-cross detection unit and the second current zero-cross detection unit further comprise reset resistors, and two ends of the reset resistor are respectively connected to the two ends of the secondary winding.

8. A totem pole bridgeless circuit system, comprising: a first bridge arm unit and a second bridge arm unit,
wherein the first bridge arm unit and the second bridge arm unit are connected in parallel between a first parallel connection point and a second parallel connection point, the first bridge arm unit comprises a first switch and a second switch connected in series in the same direction; the second bridge arm unit comprises a third switch and a fourth switch connected in series in the same direction; a power supply and an inductor are connected between a first connection point between the first switch and the second switch and a second connection point between the third switch and the fourth switch, and the second bridge arm unit further comprises:
a first current zero-cross detection unit, a second current zero-cross detection unit and a signal processing circuit, wherein the first current zero-cross detection unit and the third switch are connected in series between the first parallel connection point and the second connection point; the second current zero-cross detection unit and the fourth switch are connected in series between the second parallel connection point and the second connection point; the signal processing circuit is connected to the first current zero-cross detection unit and the second current zero-cross detection unit;
the first current zero-cross detection unit is configured to, when an AC input voltage is in a positive half cycle and a body diode of the third switch is conducted, collect a current flowing through the third switch, and obtain a current zero-cross signal of the current flowing through the third switch;
the second current zero-cross detection unit is configured to, when the AC input voltage is in a negative half cycle and a body diode of the fourth switch is conducted, collect a current flowing through the fourth switch and obtain a current zero-cross signal of the current flowing through the fourth switch;
the signal processing circuit is configured to select the current zero-cross signal collected by the first current zero-cross detection unit when the AC input voltage is in the positive half axle; select the current zero-cross signal collected by the second current zero-cross detection unit when the AC input voltage is in the negative half cycle; and
a switching control unit, connected to the signal processing circuit as well as the third switch and the fourth switch, and is configured to control ON or OFF of the third switch and the fourth switch according to a signal output by the signal processing circuit.

9. The circuit system of claim 8, wherein, structures of the first current zero-cross detection unit and the second current zero-cross detection unit respectively comprise a current transformer, a first sampling switch, a second sampling switch, a sampling resistor and a comparator, and the current transformer comprises a primary winding and a secondary winding; wherein:
the primary winding is connected with a circuit to be detected;
two ends of the secondary winding are respectively connected to drain electrodes of the first sampling switch and the second sampling switch;
a source electrode of the first sampling switch is connected to a source electrode of the second sampling switch, and the source electrodes are connected to ground;
two ends of the sampling resistor are respectively connected to the drain electrode and the source electrode of the second sampling switch; and
a negative input end of the comparator is connected to the drain electrode of the second sampling switch, and a positive input end thereof is connected to a reference voltage.

10. The circuit system of claim 8, wherein, the signal processing circuit comprises: a first AND gate, a second AND gate and an OR gate, an input end of the first AND gate is connected to an output end of the first current zero-cross detection unit and a first working frequency signal representing polarity of the AC input voltage and output by the switching control unit; an input end of the second AND gate is connected to an output end of the second current zero-cross detection unit and a second working frequency signal representing polarity of the AC input voltage and output by the switching control unit; an input end of the OR gate is connected to output ends of the first AND gate and the second AND gate.

11. The circuit system of claim 8, wherein, the first current zero-cross detection unit and the second current zero-cross detection unit further comprise reset resistors, and two ends of the reset resistor are respectively connected to the two ends of the secondary winding.

\* \* \* \* \*

UNITED STATES PATENT AND TRADEMARK OFFICE
CERTIFICATE OF CORRECTION

PATENT NO.       : 9,577,512 B2
APPLICATION NO.  : 14/896668
DATED            : February 21, 2017
INVENTOR(S)      : Jing Wang et al.

It is certified that error appears in the above-identified patent and that said Letters Patent is hereby corrected as shown below:

PCT Filed should be 5/12/2014 instead of 4/25/2014.

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*